(12) United States Patent
Corea et al.

(10) Patent No.: US 10,392,723 B2
(45) Date of Patent: Aug. 27, 2019

(54) REACTION CHAMBER FOR EPITAXIAL GROWTH WITH A LOADING/UNLOADING DEVICE AND REACTOR

(71) Applicant: LPE S.P.A., Baranzate (MI) (IT)

(72) Inventors: Francesco Corea, Baranzate (IT); Danilo Crippa, Baranzate (IT); Laura Gobbo, Baranzate (IT); Marco Mauceri, Baranzate (IT); Vincenzo Ogliari, Baranzate (IT); Franco Preti, Baranzate (IT); Marco Puglisi, Baranzate (IT); Carmelo Vecchio, Baranzate (IT)

(73) Assignee: LPE S.P.A., Baranzate (MI) (IT)

( * ) Notice: Subject to any disclaimer, the term of this patent is extended or adjusted under 35 U.S.C. 154(b) by 192 days.

(21) Appl. No.: 15/104,482

(22) PCT Filed: Dec. 17, 2014

(86) PCT No.: PCT/IB2014/002801
§ 371 (c)(1),
(2) Date: Jun. 14, 2016

(87) PCT Pub. No.: WO2015/092525
PCT Pub. Date: Jun. 25, 2015

(65) Prior Publication Data
US 2016/0312382 A1     Oct. 27, 2016

(30) Foreign Application Priority Data

Dec. 19, 2013  (IT) .............................. CO2013A0073

(51) Int. Cl.
*H01L 21/687* (2006.01)
*C23C 16/458* (2006.01)
(Continued)

(52) U.S. Cl.
CPC .......... *C30B 25/12* (2013.01); *C23C 16/4581* (2013.01); *C23C 16/4584* (2013.01);
(Continued)

(58) Field of Classification Search
None
See application file for complete search history.

(56) References Cited

U.S. PATENT DOCUMENTS

| | | | |
|---|---|---|---|
| 6,537,011 B1 * | 3/2003 | Wang ................ | H01L 21/68785 118/728 |
| 2003/0114016 A1 * | 6/2003 | Tischler ............ | H01L 21/68764 438/758 |

(Continued)

FOREIGN PATENT DOCUMENTS

| | | |
|---|---|---|
| DE | 102010017082 A1 | 12/2011 |
| KR | 0148714 * | 5/1998 |

(Continued)

OTHER PUBLICATIONS

International Search Report PCT/IB2014/002801 dated Feb. 25, 2015.

*Primary Examiner* — Binu Thomas
(74) *Attorney, Agent, or Firm* — King & Schickli, PLLC (57) ABSTRACT

A reaction chamber of a reactor for epitaxial growth includes a wall (1) with a recess and a susceptor (7) comprising a body and a relief. The body is placed in said recess in a rotational manner with respect to said wall (1). The chamber includes a discoid supporting element (8), having a shape adapted to be laid stably on said relief, having a size such to protrude radially from said relief and adapted to support one or more substrates to be subjected to epitaxial growth. The chamber also includes a flat covering (91, 92) located over said wall (1) and a hole (10) at said discoid supporting element (8). The shape of said hole (10) corresponds to the shape of said discoid supporting element (8). The covering (Continued)

(92) has at least one hollow guide (11, 12) for the passage of a device (16) for loading/unloading said discoid supporting element (8), wherein said hollow guide (11, 12) extends from an edge of said covering (92) to said hole (10).

14 Claims, 9 Drawing Sheets

(51) Int. Cl.
- *H01L 21/677* (2006.01)
- *C30B 25/12* (2006.01)
- *C30B 25/08* (2006.01)
- *C30B 29/36* (2006.01)

(52) U.S. Cl.
CPC .......... *C23C 16/4585* (2013.01); *C30B 25/08* (2013.01); *C30B 29/36* (2013.01); *H01L 21/67742* (2013.01); *H01L 21/67748* (2013.01); *H01L 21/68707* (2013.01); *H01L 21/68735* (2013.01); *H01L 21/68757* (2013.01); *H01L 21/68764* (2013.01); *H01L 21/68785* (2013.01)

(56) References Cited

U.S. PATENT DOCUMENTS

| | | | | |
|---|---|---|---|---|
| 2007/0295275 | A1* | 12/2007 | Ogliari | C23C 16/44 118/719 |
| 2008/0014057 | A1* | 1/2008 | Juergensen | C23C 14/56 414/217 |
| 2008/0190357 | A1* | 8/2008 | Karlsson | C23C 16/4584 117/200 |
| 2010/0260589 | A1* | 10/2010 | Hwang | C23C 16/4585 414/806 |
| 2013/0213300 | A1* | 8/2013 | Sung | B05C 13/02 118/712 |

FOREIGN PATENT DOCUMENTS

| | | |
|---|---|---|
| KR | 0148714 B1 | 8/1998 |
| WO | 9851844 A1 | 11/1998 |
| WO | 0005751 A1 | 2/2000 |
| WO | 2004053187 A1 | 6/2004 |
| WO | 2004053188 A1 | 6/2004 |
| WO | 2005121417 A1 | 12/2005 |
| WO | 2006024572 A1 | 3/2006 |
| WO | 2007088420 A2 | 8/2007 |

* cited by examiner

REACTION CHAMBER FOR EPITAXIAL GROWTH WITH A LOADING/UNLOADING DEVICE AND REACTOR

FIELD OF THE INVENTION

The present invention relates to a reaction chamber of a reactor for epitaxial growth adapted for use with a loading/unloading device and a reactor thereof.

The present invention relates to the field of microelectronics, more specifically to that of apparatuses for treating substrates used in the production of microelectronic components.

PRIOR ART

The reaction chamber is important for a reactor for epitaxial growth having good performance.

An important aspect of the reaction chamber is the loading and the unloading of substrates.

Such an aspect also affects the productivity of the reactor; indeed, epitaxial growth is performed at very high temperatures (e.g. the usual temperature is 1000-1200° C. for silicon and the usual temperature is 1500-1700° C. for silicon carbide) and consequently, if loading and unloading is performed at low temperature (e.g. 50-200° C.), it is necessary to wait for the chamber to heat up after loading, before starting the growth process, and to wait for the chamber to cool down before unloading.

Furthermore, it is worth noting that the substrates must be handled with particular care to prevent damage (in particular, to prevent damage to the grown layers); handling substrates at high temperature (e.g. 800-1200° C.) is even more difficult.

Finally, it is worth noting that the loading and unloading solution must combine well with the growth solution (both solutions are closely linked in the reaction chamber configuration); indeed, obtaining a good growth on the substrates is even more important than loading and unloading well the substrates.

It is a main object of the present invention to provide a good solution for loading and unloading the substrates combined with a good solution for growing on the substrates.

In particular, the present invention is focused on solutions adapted to epitaxial growth of silicon carbide.

SUMMARY

Such an objective is reached by virtue of a reaction chamber having the technical features illustrated in the appended claims, which form integral part of the present description.

LIST OF FIGURES

The present invention will become more apparent from the following detailed description to be considered in conjunction with the accompanying drawings, in which.

Such a description and such drawings are provided by way of example only and therefore are non-limiting.

These figures all refer to the same example of embodiment.

As easily apparent, the present invention, the main advantageous aspects of which are defined in the appended claims, can be made and applied in various practical manners.

DETAILED DESCRIPTION

The reaction chamber in the figures is used for epitaxial growth on substrates, specifically for epitaxial growth on silicon carbide.

The reaction chamber has an elongated shape (it is therefore possible to define a longitudinal direction, which in all the figures corresponds to the horizontal direction and even a longitudinal axis given the substantially cylindrical symmetry of the chamber) and comprises four flat walls, which delimit a parallelepiped-shaped reaction and deposition zone; the cross-section of the parallelepiped is a rectangle having a relatively large base and a relatively small height; there is a flat lower wall 1, a flat upper wall 2, a flat left side wall 3 and a flat right side wall 4. The chamber comprises other two curved walls 5 and 6; the curved wall 5 is joined by its ends to the ends of the flat wall 1 (e.g. see FIG. 2); the curved wall 6 is joined by its ends to the ends of the flat wall 2 (e.g. see FIG. 2). In the figures, the walls 1, 2, 3, 4, 5, 6 are shown as if they were made in one piece, but they could be distinct parts, arranged side by side and appropriately joined. Such a set of walls is known, for example and in particular, in international patent applications WO 2004/053187 and WO 2004/053188 to which reference is made for further technical details.

Figure 1:
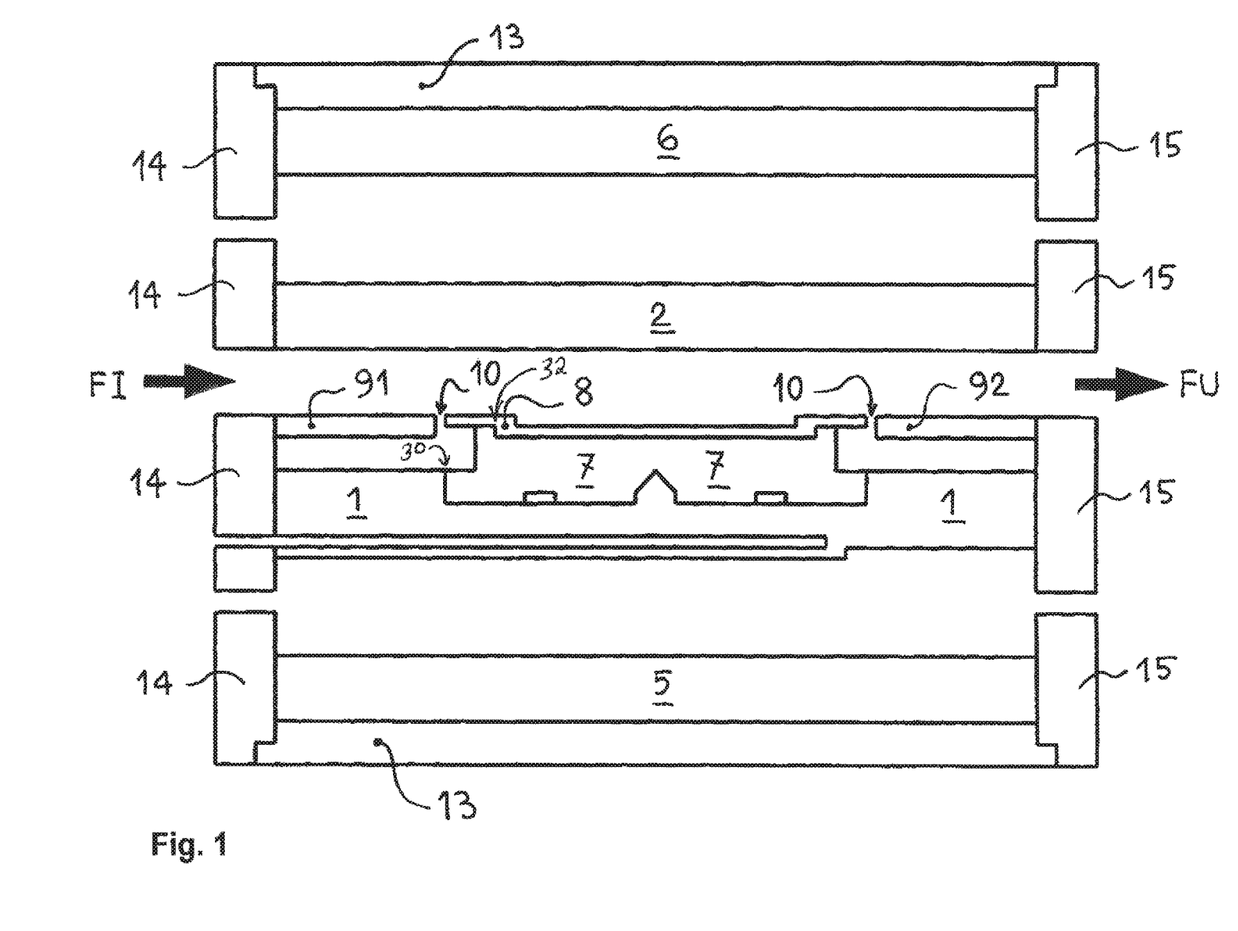
FIG. 1 shows a simplified section view of an example of embodiment of a reaction chamber according to the present invention.
Figure 5:
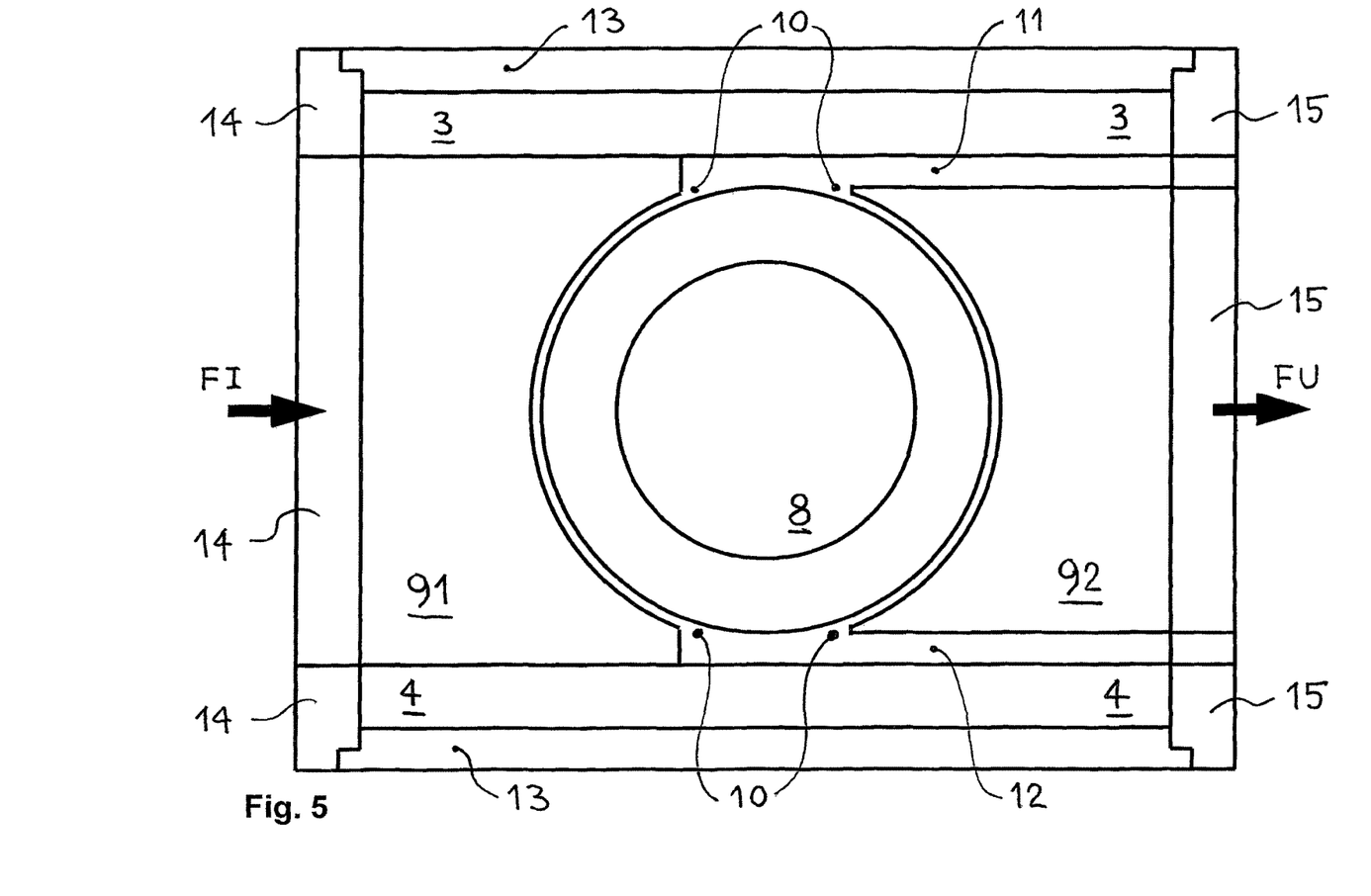
FIG. 5 shows a simplified top view of the reaction chamber in FIG. 1.

The two arrows drawn in FIG. 1 and in FIG. 5 represent the incoming flow FI of reaction gases and the outgoing flow FU of exhaust gases; the reaction gases enter the reaction and deposition chamber, chemically react because of the high temperature in this zone, give rise to a deposition of solid material, and exit as exhaust gas (more or less exhausted) from the reaction and deposition zone. It is worth noting that the heating means of the reaction chamber are not shown in any of the figures; they are typically electromagnetic heating means.

Furthermore, the reaction chamber comprises a susceptor 7 and a supporting element 8 adapted to support one or more substrates to subject to epitaxial growth simultaneously (each substrate is positioned in a shallow "recess" of the supporting element respectively); the supporting element 8 stably lays on the susceptor 7. In particular, the susceptor 7 comprises a body (typically cylindrical) underneath and a relief 32 (typically either cylindrical or prismatic) above. In particular, the supporting element 8 is discoid and is typically circular-shaped; the supporting element 8 is laid stably on the relief 32 of the susceptor 7 and is sized to protrude radially from the relief 32 of the susceptor 7.

The lower wall 1 has a recess 30 in which the body of the susceptor 7 is placed; typically, recess and body have the same shape; in the example in the figures, recess and body have exactly the same cylindrical shape and nearly the same dimensions (there is only a small difference to allow the rotation of the body in the recess); the body of the susceptor 7 is placed in the recess 30 to be rotational with respect to wall 1; the supporting element 8 rotates as a consequence when the susceptor 7 rotates. In the figures, it is worth noting that there are hollows and a central blind hole in the lower face of the body of the susceptor 7; the blank hole is used to receive a pin of the wall 1 which guides the rotation of the susceptor 7; the hollows are used to receive the gas jets to cause the rotation of the susceptor; these gas jets derive from a gas flow which originates outside the reaction chamber and which crosses the lower wall 1 inside a longitudinal and central conduit to the susceptor 7, in particular to the zone under the recess 30 of the wall 1 in which the body of the susceptor 7 is placed. Such a system is known, for example and in particular, from international patent application WO 2005/121417, to which reference shall be made for further technical details.

Finally, the reaction chamber comprises a flat covering, corresponding to the components indicated by reference numerals 91 and 92, which are visible in FIG. 1, FIG. 3, FIG. 4 and FIG. 5 in particular. The two covering elements 91 and 92 constitute two conceptually adjacent elements of a single flat covering; such a flat covering extends both longitudinally and transversely for the entire reaction and deposition zone (see FIG. 5 in particular), except for the hole 10, as will be described in greater detail below; in general, the flat covering could consists of a plurality of adjacent elements; for example, the first covering element 91 and the second covering element 92 could be divided into two, one on a first side, e.g. on the right (considering the longitudinal direction of the chamber) and one on the second side, e.g. on the left of the chamber (considering the longitudinal direction of the chamber).

In the example of the figures, such covering elements essentially consist of two flat sheets: a first covering element 91 in the form of a sheet is located in the inlet zones of the chamber and a second covering element 92 in the form of a sheet is located in the outlet or exhaust zone of the chamber; reference should be made to arrow FI and to arrow FU for the sake of clarity. It is worth noting that the means used for fixing the covering elements to the chamber, in particular to fix them to the openings of the chamber are not shown in any of the figures. The term "flat covering" derives from the fact that it is used to cover the wall underneath, which is the lower wall 1, and which is used to make a flat surface (to the greatest possible extent) as lower limit of the reaction and deposition zone—the cross-section of the reaction and deposition zone should be as constant as possible for the entire length of the zone itself to obtain a good growth on the substrates, and rather typically this section is rectangular or at least the lower side is straight.

Figure 2:
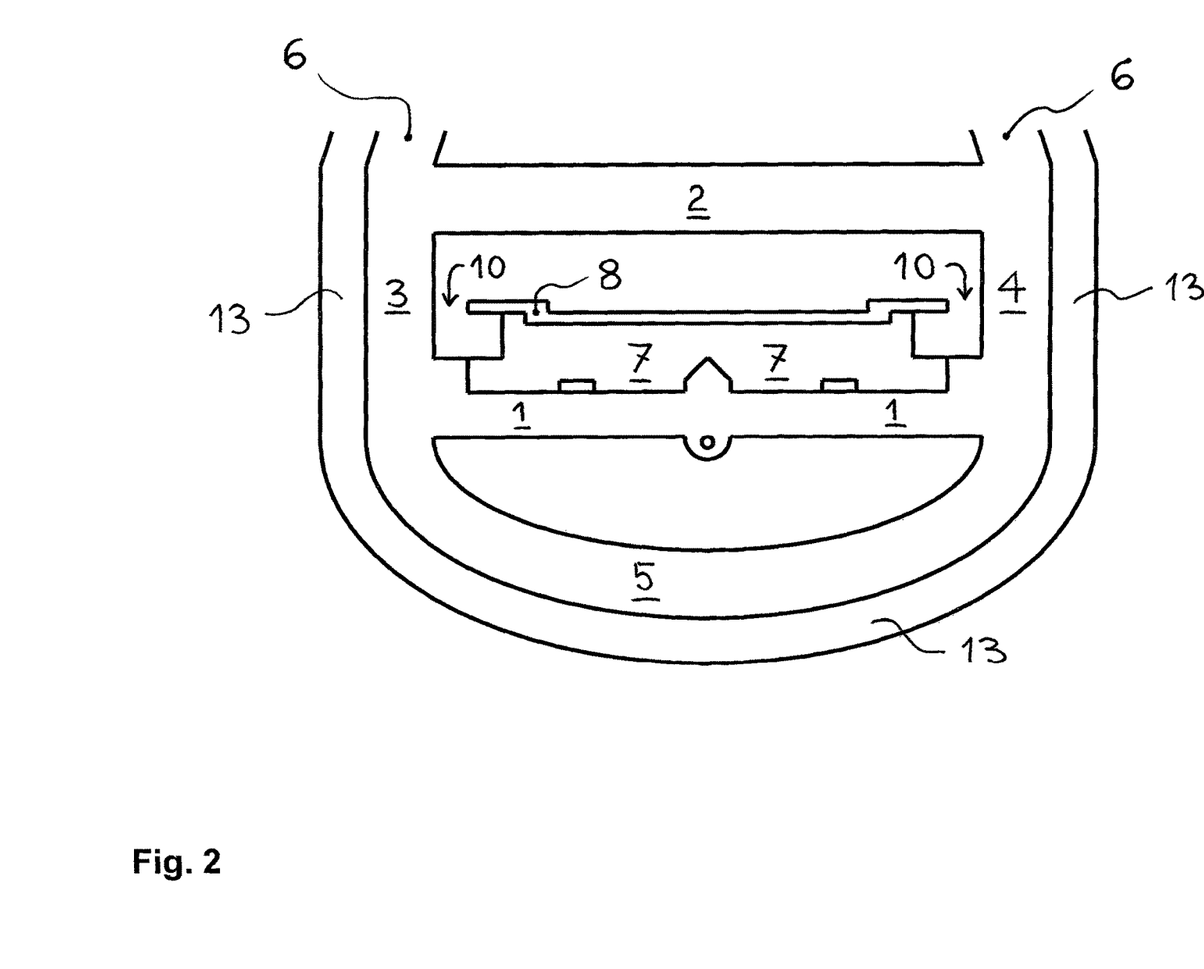
FIG. 2 shows a first simplified cross-section view (taken along a first section plane) of the reaction chamber in FIG. 1.

The flat covering, whole of the two covering elements 91 and 92, has a hole 10 at the supporting element 8 (see FIG. 1, FIG. 2 and FIG. 5). The shape of the hole 10 corresponds to the shape of the supporting element 8; for the reasons which will be explained below, the shape of the hole 10 is not exactly identical to the shape of the supporting element 8 (in particular, it is slightly greater). As clearly shown in FIG. 1, the upper surfaces of the covering elements 91 and 92 and the upper surface of the supporting element 8 are aligned (FIG. 1 shows the recess of the supporting element 8 which is exactly filled with a substrate).

Furthermore, the flat covering has at least one hollow guide (i.e. not in relief) for the passage of a device for loading/unloading the supporting element.

In the example in the figures (see FIG. 5 in particular), the covering element 92 has two hollow guides 11 (on the left in FIG. 4) and 12 (on the right in FIG. 4) for the passage of a device 16 (see FIG. 6) for loading/unloading the supporting element 8; both guides 11 and 12 extend starting from the same front edge of the covering element 92 to the hole 10; the hollow guides 11 and 12 are parallel and at the two side edges of the covering element 92; alternatively, such guides may be made, for example, as parallel cuts in the element 92 at a slight distance from the two side edges.

Figure 3:
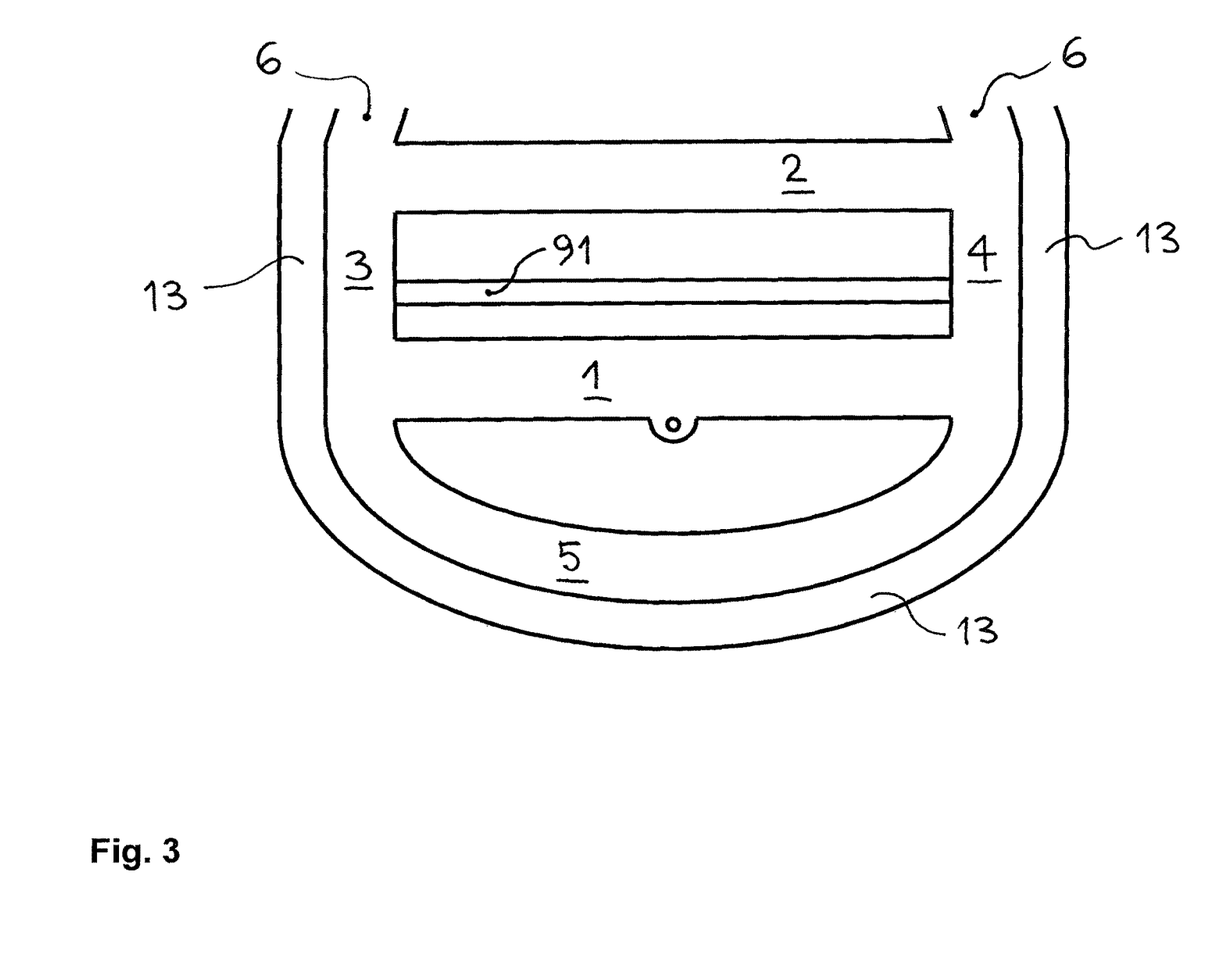
FIG. 3 shows a second simplified cross-section view (taken along a second section plane) of the reaction chamber in FIG. 1.
Figure 4:
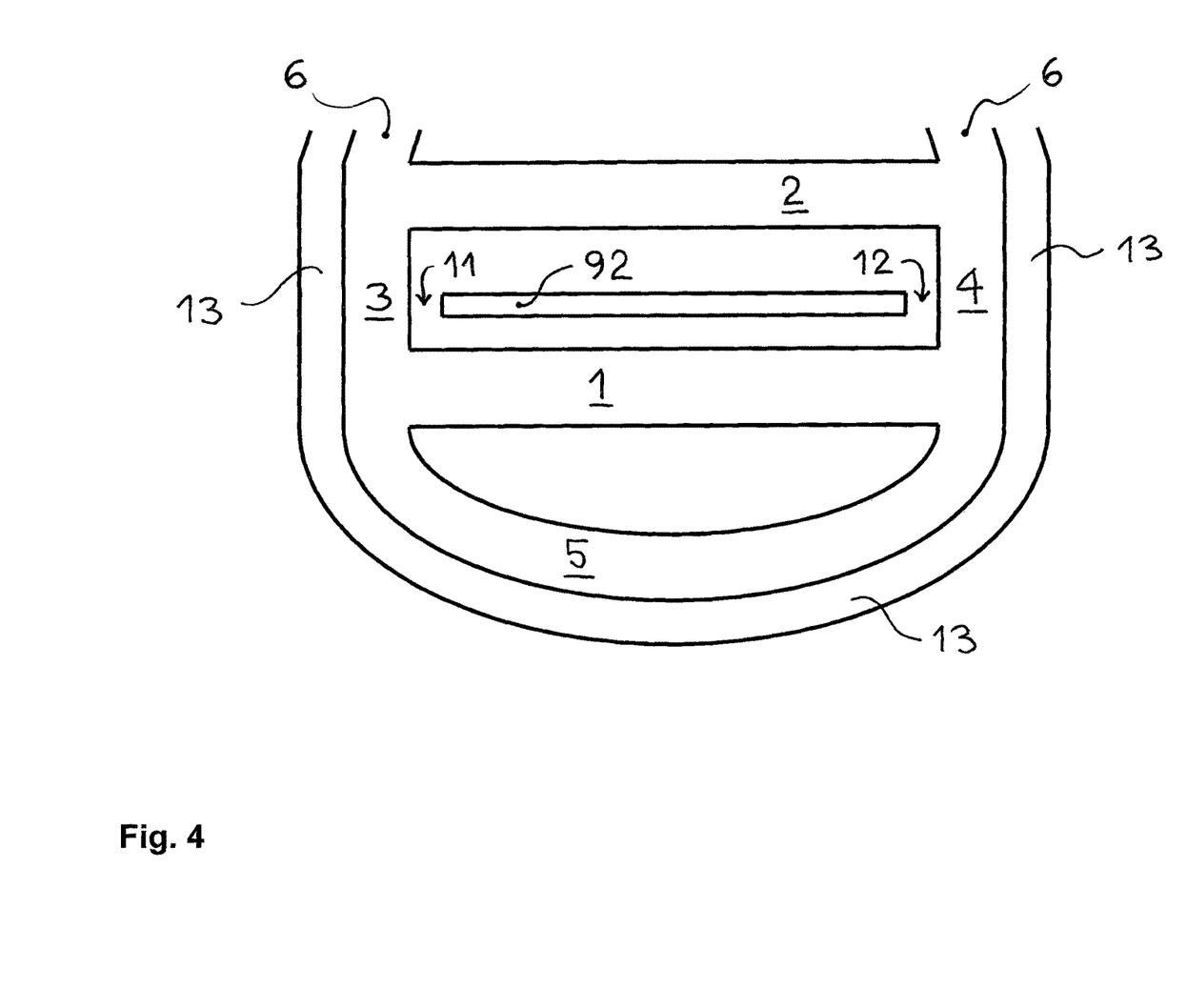
FIG. 4 shows a third simplified cross-section view (taken along a third section plane) of the reaction chamber in FIG. 1.

The cross-section plane in FIG. 2 is exactly in the center of the chamber; the cross-section plane in FIG. 3 is half way between center and inlet; the cross-section plane in FIG. 4 is half way between center and outlet.

In FIG. 5, the hole 10 is circle-shaped and the guides 11 and 12 extend to two peripheral zones of the circle opposite with respect to its center (for this reason, the shape of the hole appears as a partial circle).

As mentioned, the device 16 is used for loading/unloading the supporting element 8 and the chamber is provided with appropriate spaces for passing it and lifting it together with the supporting element.

It is thus apparent that the solution allows to unload the substrates at very high temperatures (1000° C. or even higher) because it is the supporting device to be handled, and not the substrates directly. A similar consideration applies to the loading of the substrates.

The whole of the walls (1, 2, 3, 4, 5 and 6 in the figures) of the chamber, which has a substantially cylindrical (or alternatively substantially elliptical) outer shape, is surrounded by heat insulating material, in particular fibrous or porous or foamy graphite; laterally, there is a layer 13 of heat insulating material which is adjacent to the walls 3, 4, 5 and 6; frontally, there is a first layer 14 (in particular, circular or elliptical) made of heat insulating material which is placed at the inlet of the chamber; frontally, there is a second layer 15 (in particular, circular or elliptical) made of heat insulating material which is placed at the outlet of the chamber; the layers 14 and 15 have openings for letting in reaction gases, for letting out exhaust gases and for the other secondary gas flows through the chamber walls.

Advantageously, a reaction chamber like the one diagrammatically shown in the figures from FIG. 1 to FIG. 5 may further have constructive elements, e.g. all or part of those described and illustrated in international patent applications WO 2006/024572 and WO 2007/088420.

Figure 6:
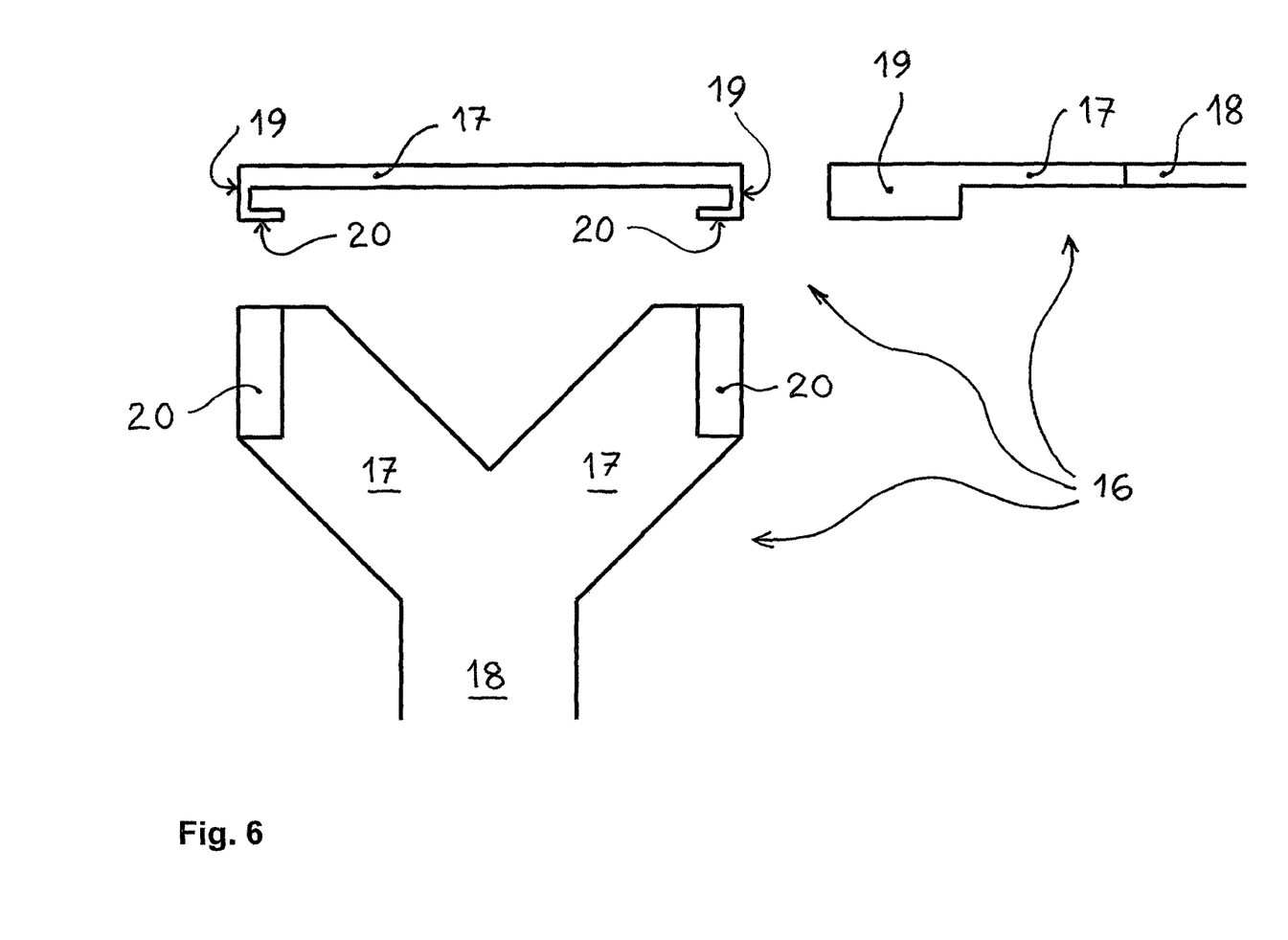
FIG. 6 shows three different side views of an example of embodiment of a loading/unloading device adapted for the reaction chamber in FIG. 1.

FIG. 6 shows an example of embodiment of a loading/unloading device adapted for the reaction chamber of the figures appended hereto.

The device 16 is designed to lift and transport the substantially flat discoid element, in particular the supporting element 8; the device 16 can lift and transport elements of various shapes, even if the supporting element 8 is circle-shaped. The parts of the device 16 which are used to grip the supporting element 8 correspond substantially to two wings 20 and two shoulders 19; the device 16 is adapted to lift the supporting element 8 by pushing on its lower edge by means of the wings 20.

More in detail, the device 16 comprises:
at least one maneuvering rod 18 (adapted to be arranged horizontally) (only partially shown in FIG. 6), the two shoulders 19 (adapted to be arranged vertically), in the form of two small rectangular plates, joined to the rod 18 by means of a "V"-shaped branch 17 of the rod 18, and the two wings 20 (adapted to be arranged horizontally), in the form of two small rectangular plates joined respectively to the two shoulders 19.

The shape of the branch of the maneuvering rod could be different from a "V", e.g. it could be semicircle-shaped.

The length of the rod 18 is such to protrude for a horizontal stretch (e.g. 10-40 cm) from the reaction and deposition zone, in particular from the layer 15, precisely to allow to be maneuvered; typically and advantageously, the rod 18 is adapted to be maneuvered by a robot.

Figure 7A:
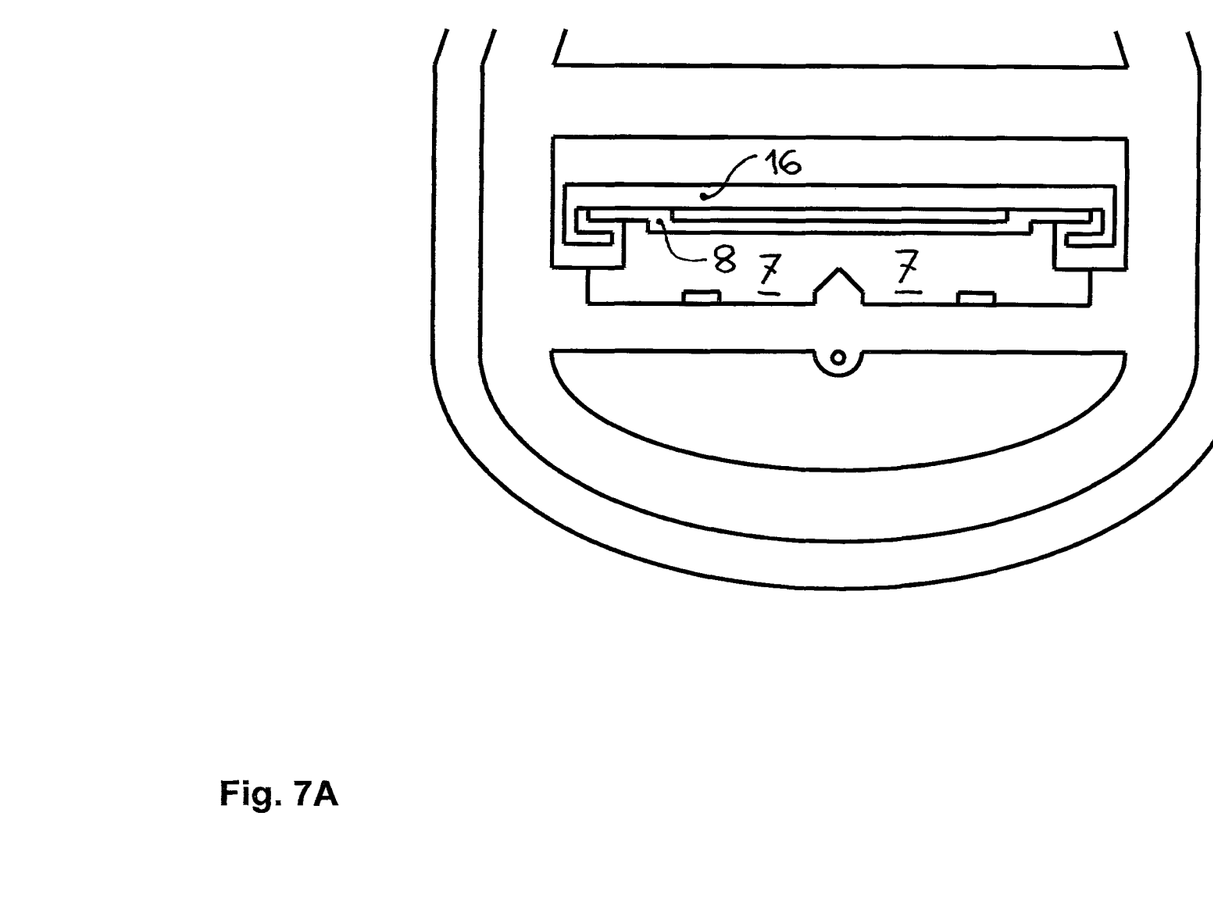
FIG. 7 shows simplified cross-section views (taken along the section plane used in FIG. 2) of the chamber in FIG. 1 in combination with the device in FIG. 6 in three different conditions.
Figure 7B:
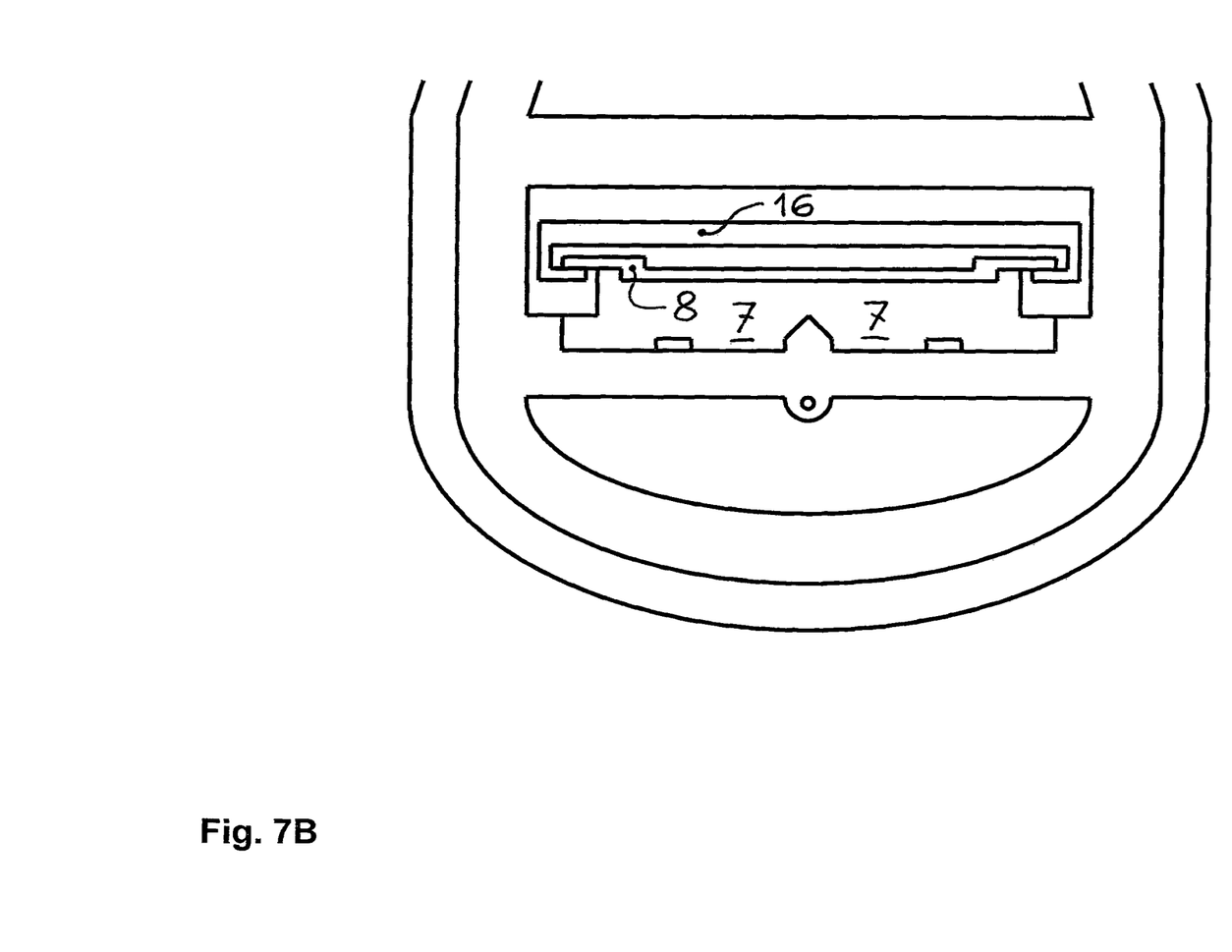
Figure 7C:
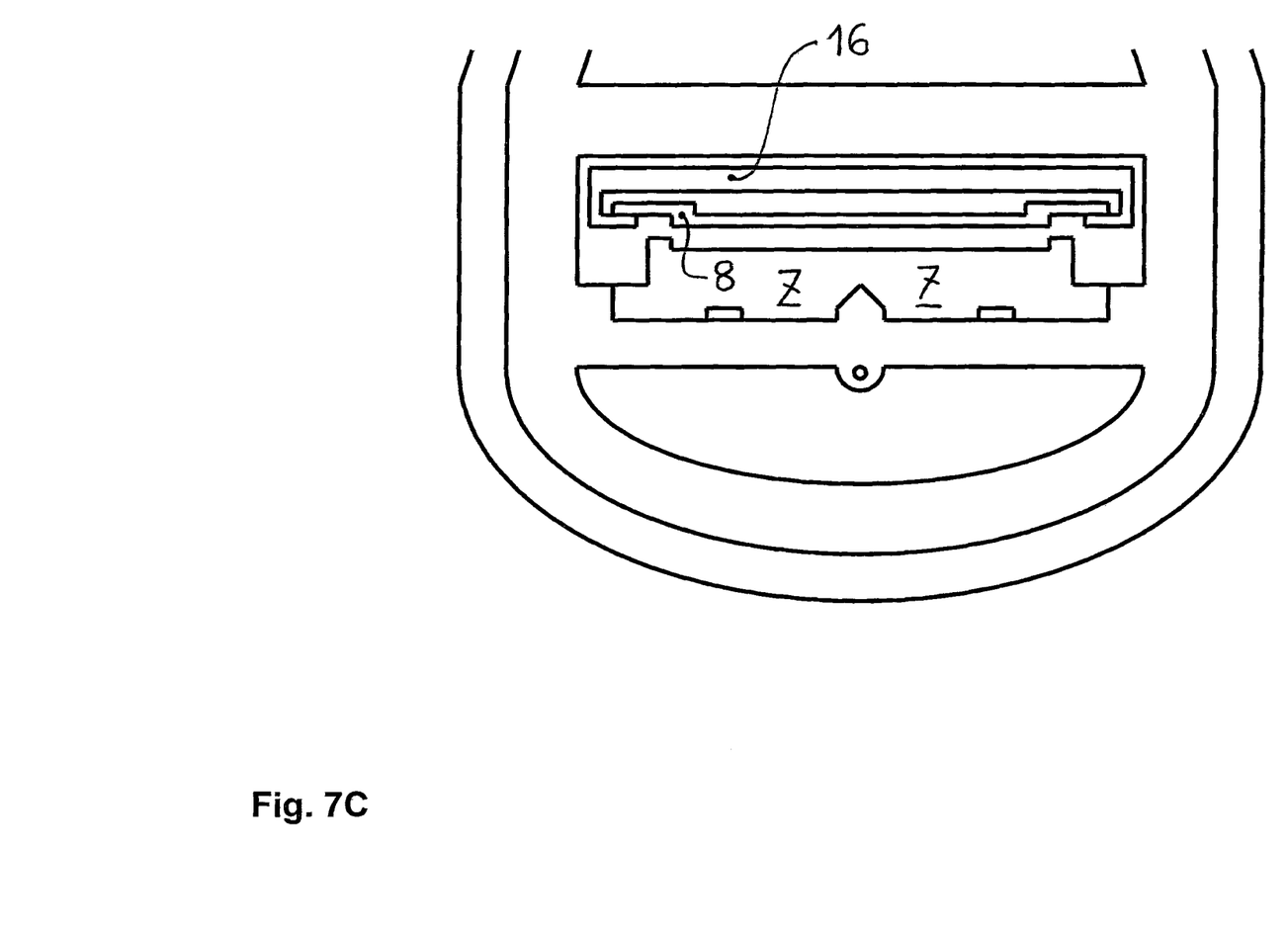

Reference may be made to FIG. 7A, FIG. 7B and FIG. 7C to understand the loading and unloading operations of the supporting element 8 by means of the device 16.

The device 16 is inserted in the chamber from its outlet, maintaining the chamber horizontal and the device horizontal and orienting the device so that the shoulders 19 and the wings 20 enter the chamber first and then the maneuvering rod 18, which is precisely used to maneuver it. The insertion occurs so that the rod 18 and its branch 17 are slightly over the covering 92, the two wings 20 are slightly over the covering 92 and the two shoulders 19 are by the side of the covering 92 of the two guides 11 and 12, respectively. The device 16 is made to slide horizontally until the wings 20 reach the side of the supporting element 8 (see FIG. 5)—the center of the wings 20 is thus substantially in the central cross plane of the chamber where the center of the supporting element 8 is also located. In this situation (FIG. 7A), the supporting element 8 which supports a newly treated substrate rests on the susceptor 7, the lower surface of the branch 17 is over the supporting element 8 and much closer thereto (in FIG. 7A they appear in contact but there is a given distance); the wings 20 are located under the edge of the supporting element 8 and slightly distanced therefrom. The device 16 (FIG. 7B) is slightly lifted, the supporting element 8 rests on the susceptor 7, the lower surface of the branch 17 is over the supporting element 8 and slightly distanced therefrom; the wings 20 are in contact with the edge of the supporting element 8. The device 16 (FIG. 7C) is lifted further, the supporting element 8 no longer rests on the susceptor 7 and is sufficiently distanced therefrom, the lower surface of the branch 17 is over the supporting element 8 and slightly distanced therefrom; the wings 20 are in contact with the edge of the supporting element 8. At this point, the device 16 and the supporting element 8 may be extracted from the chamber by making them slide horizontally backwards towards the outlet of the chamber.

An element 8 which supports a substrate to be treated is inserted as described above, but in the opposite sense.

From the above, it is apparent that among other matters the horizontal sliding of the device 16 must be accurately controlled, in particular when it is inserted (both when carrying a supporting element with one or more substrates to be treated and when supporting nothing). For this purpose, for example, the covering element 92 may be provided with a rod-shaped protrusion (not shown in the figures) adapted to protrude for a horizontal stretch (e.g. 10-40 cm) from the reaction and deposition zone, in particular from layer 15. Since the position of the element 92 defines the position of the hole 10 and is closely correlated to the position of the susceptor 7, it is possible to determine when to interrupt the sliding of the device 16 from the outside with good accuracy; in other words, the outer end of the rod-shaped protrusion can be used as horizontal (and vertical) reference for the movements of the device 16.

The choice of materials of its components is important in order to obtain a good operation of the reaction chamber, and thus of the reactor. A series of possible solutions, which are good in themselves and excellent in combination, are described below.

The walls of the chamber, in particular the lower wall 1, may be made of graphite, not necessarily coated because of the presence of the covering, i.e. of the covering elements 91 and 92.

The susceptor 7 may be made of graphite and does not need to be coated because of the presence of the covering, i.e. of the covering elements 91 and 92.

The supporting element 8 may be made of graphite entirely coated with a layer of silicon carbide except for where it supports one or more substrates; the covering is used to avoid, or at least limit, problems of bulging (e.g. related to spurious depositions during the epitaxial growth processes).

The flat covering, in particular the covering elements 91 and 92, is made of graphite entirely coated with a layer of silicon carbide; the covering is used to avoid or at least limit problems of bulging (e.g. related to spurious depositions during the epitaxial growth processes).

The loading/unloading device 16 may be made entirely of quartz to be rigid, robust and to prevent problems related to the high temperatures of the chamber. Although the device is made of quartz, it is appropriate to evaluate the loading and unloading temperatures of the supporting element 8 for the device 16 to perform its lifting and transporting functions appropriately. The reaction chamber apparatus according to the present invention, in particular a' reaction chamber as the one described above, is typically used in reactors for epitaxial growth. Being a hot wall chamber with a particular segregation of the reaction and deposition zone with a particular solution for transferring energy to the chamber for heating it, it is particular adapted for the reactors which require very high temperatures, e.g. 1500° C. and higher; such very high temperatures are the ones used for epitaxial deposition of silicon carbide on substrates (typically silicon carbide). Incidentally, the indications related to materials and coatings described above are precisely defined for epitaxial growth of silicon carbide in particular.

The invention claimed is:

1. A reaction chamber of a reactor for epitaxial growth having a reaction and deposition zone and comprising:
    a wall with a recess,
    a susceptor comprising a body and a relief, wherein said body is placed in said recess so that said body rotates with respect to said wall,
    a discoid supporting element adapted to be laid stably on said relief such that the discoid supporting element rotates with the susceptor, the discoid supporting element having a shape with a size such to protrude radially from said relief and adapted to support one or more substrates to be subjected to epitaxial growth, and
    a flat covering located inside said reaction and deposition zone over said wall and fixed with respect to the reaction chamber, said flat covering having an upper surface aligned with an upper surface of said discoid supporting element and having a hole at said discoid supporting element;
    wherein the shape of said hole corresponds to the shape of said discoid supporting element;
    wherein said flat covering has a first hollow guide and a second hollow guide for the passage of a device for loading/unloading said discoid supporting element, wherein said first hollow guide and said second hollow guide extend starting from an edge of said flat covering to said hole;

wherein said hole is circle-shaped, and wherein said first and second hollow guides extend to two peripheral zones of the circle opposite with respect to its center.

2. A reaction chamber according to claim 1, wherein said first and second hollow guides are parallel.

3. A reaction chamber according to claim 2, wherein said first and second hollow guides are at the two side edges of said flat covering.

4. A reaction chamber according to claim 1,
wherein said wall is made of uncoated graphite;
wherein said susceptor is made of uncoated graphite;
wherein said supporting element is made of graphite entirely coated with a layer of silicon carbide except for where it supports one or more substrates; and
wherein said flat covering is made of graphite entirely coated with a layer of silicon carbide.

5. A reaction chamber according to claim 1, provided with the device for loading unloading said supporting element adapted to lift said supporting element by pushing on the edge thereof from the bottom.

6. A reaction chamber according to claim 5, wherein said loading/unloading device comprises:
at least one maneuvering rod,
two shoulders, joined at said at least one maneuvering rod and adapted to slide in said hollow guides, and
two wings, joined respectively to said two shoulders and adapted to push on the edge of said supporting element from the bottom.

7. A reaction chamber according to claim 5, wherein said loading/unloading device is entirely made of quartz.

8. A reactor for epitaxial growth comprising:
a reaction chamber including:
a wall with a recess,
a susceptor comprising a body and a relief, wherein said body is placed in said recess so that said body rotates with respect to said wall,
a discoid supporting element adapted to be laid stably on said relief such that the discoid supporting element rotates with the susceptor, the discoid supporting element having a shape with a size such to protrude radially from said relief and adapted to support one or more substrates to be subjected to epitaxial growth, and
a flat covering located inside said reaction and deposition zone over said wall and fixed with respect to the reaction chamber, said flat covering having an upper surface aligned with an upper surface of said discoid supporting element and having a hole at said discoid supporting element;

wherein the shape of said hole corresponds to the shape of said discoid supporting element;

wherein said flat covering has a first hollow guide and a second hollow guide for the passage of a device for loading/unloading said discoid supporting element, wherein said first hollow guide and said second hollow guide extend starting from an edge of said flat covering to said hole; and wherein said hole is circle-shaped, and wherein said first and second hollow guides extend to two peripheral zones of the circle opposite with respect to its center, wherein the reactor includes further a loader/unloader for inserting or removing said discoid supporting element to/from the reaction chamber.

9. The reactor for epitaxial growth of claim 8, wherein said first and second hollow guides are parallel.

10. The reactor for epitaxial growth of claim 9, wherein said first and second hollow guides are at two side edges of said covering.

11. A reactor for epitaxial growth of claim 8,
wherein said wall is made of uncoated graphite;
wherein said susceptor is made of uncoated graphite;
wherein said supporting element is made of graphite entirely coated with a layer of silicon carbide except for where it supports one or more substrates;
wherein said flat covering is made of graphite entirely coated with a layer of silicon carbide.

12. A reactor for epitaxial growth of claim 8, wherein said loader/unloader is adapted to lift said supporting element by pushing on the edge thereof from the bottom.

13. The reactor for epitaxial growth according to claim 12, wherein said loader/unloader comprises:
at least one maneuvering rod,
two shoulders, joined at said at least one maneuvering rod and adapted to slide in said hollow guides, and
two wings, joined respectively to said two shoulders and adapted to push on the edge of said supporting element from the bottom.

14. The reactor for epitaxial growth according to claim 12, wherein said loader/unloader is entirely made of quartz.

* * * * *